United States Patent [19]

Wicker et al.

[11] Patent Number: 4,724,510
[45] Date of Patent: Feb. 9, 1988

[54] ELECTROSTATIC WAFER CLAMP

[75] Inventors: Thomas E. Wicker, Vallejo; Roger B. Lachenbruch, Sausalito, both of Calif.

[73] Assignee: Tegal Corporation, Novato, Calif.

[21] Appl. No.: 941,234

[22] Filed: Dec. 12, 1986

[51] Int. Cl.⁴ .............................................. H01H 1/06
[52] U.S. Cl. .................................................... 361/234
[58] Field of Search .................... 361/230, 234, 233; 269/903

[56] References Cited

U.S. PATENT DOCUMENTS

| | | | |
|---|---|---|---|
| 4,184,188 | 1/1980 | Briglia | 361/234 |
| 4,384,918 | 5/1983 | Abe | 361/234 X |
| 4,480,284 | 10/1984 | Tojo et al. | 361/234 |
| 4,502,094 | 2/1985 | Lewin et al. | 361/234 |
| 4,645,218 | 2/1987 | Ooshio et al. | 361/234 |

Primary Examiner—L. T. Hix
Assistant Examiner—Brian W. Brown
Attorney, Agent, or Firm—Paul F. Wille

[57] ABSTRACT

A wafer clamp is disclosed in which a high voltage capacitor is formed on a semiconductor wafer, which rests on a conductive support. The plates of the capacitor comprise a plurality of concentric rings formed on the surface of the wafer with alternate rings connected together.

5 Claims, 6 Drawing Figures

ELECTROSTATIC WAFER CLAMP

BACKGROUND OF THE INVENTION

This invention relates to wafer handling apparatus and, in particular, to an electrostatic clamp for holding semiconductor wafers.

As known in the art, clamps for semiconductor wafers enable one to improve heat transfer between a wafer and an electrode upon which it rests. Without a clamp of some sort, a gap exists between the wafer and the electrode except at a few points of contact, even for nominally flat wafers and electrodes. Heat transfer is very dependent upon the air (gas) pressure within this gap. At low pressure, such as used in processing the wafer, heat transfer is very poor.

Clamping a wafer increases the number of points of contact. If compliant material is used between the wafer and the electrode, the area of contact is increased and heat transfer is improved. Good heat transfer, whether to or from the wafer, enables better control of the temperature of the wafer, resulting in better process control.

A variety of electrostatic clamps have been proposed in the prior art. In U.S. Pat. No. 4,184,188, an electrostatic clamp is disclosed comprising parallel lines formed by interdigitated, printed circuit conductors. The lines are insulated from the wafer by RTV silicone and are formed on a thermally conductive, electrically insulative support.

In U.S. Pat. No. 4,480,284, the wafer clamp is disclosed as comprising a conductive material having dielectric material flame spray coated thereon and then smoothed with a layer of plastic. The semiconductor wafer forms one plate of a capacitor having the conductive material as the other plate.

In U.S. Pat. No. 4,502,094, the static voltage is also applied to the wafer which rests on a conductive support having a plurality of electrodes formed therein and separated from the support by insulating material.

While describing functional wafer clamps, some of these patents describe rather high voltage, e.g. 4,000 volts, as typical. In applications such as plasma etching, the high voltage can cause problems with uniformity of the etch. Further, one typically couples RF energy through the electrode on which the wafer rests. Electrostatic clamps of the prior art are not particularly suited to coupling RF power to a semiconductor wafer due to the dielectric films on the clamp. Finally, there is a continuing need to reduce the cost of manufacturing the wafer clamp.

In view of the foregoing, it is therefore an object of the present invention to provide an improved electrostatic wafer clamp.

Another object of the present invention is to provide an easily manufactured electrostatic wafer clamp.

A further object of the present invention is to provide an electrostatic wafer clamp for coupling RF power to a wafer.

Another object of the present invention is to provide an electrostatic wafer clamp having higher clamp strength for a given applied voltage.

SUMMARY OF THE INVENTION

The foregoing objects are achieved in the present invention wherein a silicon wafer is used as the electrostatic clamp element. An interdigitated capacitor comprising concentric rings is formed on the upper surface of the wafer and insulated by silicon dioxide. The wafer rests on a conductive support to provide good thermal conductivity.

BRIEF DESCRIPTION OF THE DRAWINGS

A more complete understanding of the present invention can be obtained by considering the following detailed description in conjunction with the accompanying drawings, in which.

DETAILED DESCRIPTION OF THE INVENTION

Figure 1:
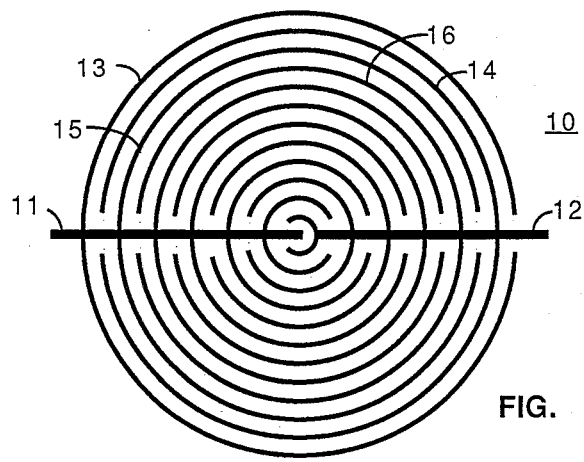
FIG. 1 illustrates a preferred embodiment of the capacitor in accordance with the present invention.

FIG. 1 illustrates a preferred embodiment of the shape of the plates of the capacitor used for the electrostatic clamp. Specifically, capacitor 10 comprises buses 11 and 12 connected to a plurality of interdigitated, concentric rings 13-16 in which alternate rings are connected to the same bus; e.g. rings 13 and 15 are connected to bus 11 while rings 14 and 16 are connected to bus 12. In particular, it has been found that improved RF coupling as well as improved clamp strength is obtained by providing non-intersecting, non-parallel plates comprising buses 11 and 12 and the rings connected to each. As more fully illustrated in FIGS. 2-5 the plates comprise an etched conductive layer, such as aluminum, molybdenum, or doped silicon, formed on the surface of a semiconductor wafer, using standard processing techniques. Thus one obtains as fine a pattern as desired, within the restrictions imposed by the applied voltage, yet an electrostatic clamp which is readily made at very low cost.

As an example of an implementation of the present invention, but not by way of limitation, the following dimensions were used in making an electrostatic wafer clamp in accordance with the present invention. Buses 11 and 12 were each 62 mils (1.6 mm) wide and separated from the rings of the other by the same distance. The rings themselves were 31 mils (0.8 mm) wide and separated from each other by the same distance. For a four inch (100 mm) wafer, the outer diameter of the outer ring was 3.5 inches (89 mm).

Figure 2:
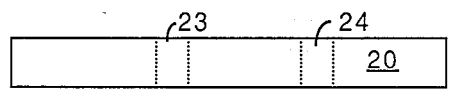
FIGS. 2-5 illustrate the steps in fabricating a wafer clamp in accordance with the present invention.

FIG. 2 illustrates a wafer upon which buses 11 and 12 are to be formed. By way of example only, and not by way of limitation, wafer 20 preferably comprises a (100) n-type conductivity wafer having a resistivity of 5-10 ohms centimeters and a thickness of 20 mils (0.5 mm). While other materials could be used as the basis for the capacitor, a semiconductor wafer having these characteristics is readily obtainable.

Electrical contact to the buses of the capacitor could be made in several ways, from above the wafer, at the edge, or through the wafer from below. The latter is preferred to avoid exposure to the plasma. Holes 23 and 24 are etched or drilled through the wafer. These holes are approximately 0.5 mm. (20 mils) in diameter and will receive contact pins which engage corresponding holes in the electrode.

Figure 3:

As illustrated in FIG. 3, wafer 20 is oxidized to form oxide layer 21. In one embodiment of the present invention, wafer 20 was subjected to a dry oxidation for thirty minutes, a wet oxidation for six hours and a dry oxidation for thirty minutes at 1200° C. to form layer 21 having a thickness of about one and one-half micron.

Figure 4:

As illustrated in FIG. 4, conductive layer 22, which preferably comprises aluminum, is then deposited over oxide layer 21. In one embodiment of the present invention, the conductive layer was deposited to a thickness of five microns. In a second embodiment, the conductive layer was deposited to a thickness of one and one-half micron. The conductive layer must extend into holes 23 and 24 to form contacts as described in conjunction with FIG. 5.

Figure 5:
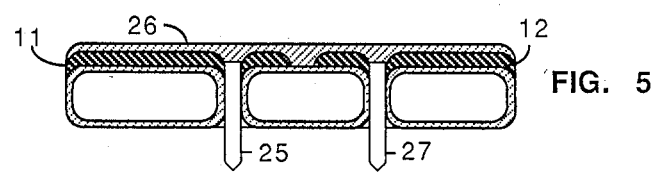

As illustrated in FIG. 5, the conductive layer is then etched by any suitable technique to form the pattern illustrated in FIG. 1. Specifically, the rings are interdigitated with alternate ones connected respectively to buses 11 and 12.

Wafer 20, having the patterned electrodes formed thereon, is then coated with a suitable insulator such as silicon dioxide. In one embodiment of the present invention, this oxide was deposited to a thickness of approximately one to four microns, as measured from the top of conductive layer 22. Insulating layer 26 can be formed for example by depositing CVD oxide or spinning on a polyimide or spinning on a suitable glass. Contact pins, such as pin 25, are then inserted into the holes in wafer 20 and held in place, for example, by conductive epoxy.

Figure 6:
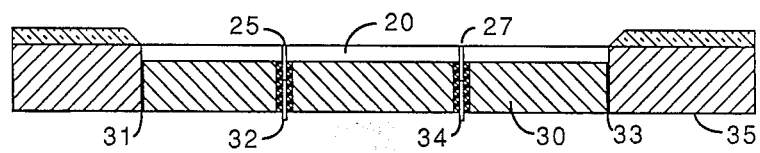
FIG. 6 illustrates a wafer clamp installed in a plasma reactor in accordance with the present invention.

As illustrated in FIG. 6, wafer 20 is placed on conductive support 30 which is electrically separated from plate 35 by insulators 31 and 33. Conductive leads 32 and 34 contact pins 25 and 27 in wafer 20 in bores within support 30. The pins fit closely within the bores in support 30 and serve both as electrical contacts to the electrodes as well as mechanical positioning means for the clamp. A wafer to be processed fits within the tapered hole provided by insulator 36 and is held in place by the electrostatic clamp formed on wafer 20. Conductive support 30 is typically the lower electrode of a plasma reactor.

There is thus provided by the present invention an improved electrostatic clamp which is considerably less expensive to manufacture than those of the prior art yet one which achieves a better performance in terms of clamping force, reduced operating voltage, thermal conductivity, RF coupling, and ease of replacement.

Although the force of electrostatic attraction is not as great as the force obtainable from a mechanical clamp, this is not a disadvantage with the present invention. By using a semiconductor wafer, one obtains a rigid but thin disk with a polished and very flat surface. Because it is thin, and has relatively good thermal conductivity, heat transfer through it is good. Its rigidity insures it will remain flat. In addition, standard wafer processing techniques can be used to form the layers which make up the clamp so that very thin layers can be used. The final surface can be kept very smooth and flat so that contact area for heat transfer is optimized and the need for a compliant layer reduced or eliminated. Compliant films have the disadvantage of being susceptible to puncture and therefore have low reliability.

Conventional electrostatic clamps have used layers on the order of a mil or more in thickness. The dielectrics were sheets of material which were held in place with an adhesive. In accordance with the present invention, the dielectric is on the order of a micron in thickness, i.e. thinner by a factor of twenty-five. Generally, dielectrics are poor thermal conductors. Thus, the thinner they are, the better they transfer heat. The attractive force is proportional to the square of the electric field, which is proportional to the square of the ratio of the voltage across the top dielectric of the clamp to the dielectric's thickness. Thinner dielectrics allow the use of much lower voltages to achieve a given force of attraction. Thus, use of the clamp is much less likely to damage wafers or the devices formed thereon. In accordance with the present invention voltages from 50 to 100 volts are used.

In order to use such thin dielectrics, their defect density must be well controlled. The use of a silicon wafer as the substrate in accordance with the present invention takes advantage of the years of research that have gone into the development of depositing low defect, thin dielectrics on silicon wafers for integrated circuit fabrication.

The thickness of the dielectric also affects impedance. If support 30 were connected to a source of RF signal at 100 KHz, it can be shown that the impedance per unit area is 28.8 for five micron dielectrics, as used in the present invention, and 717.9 for five mil dielectrics as used in the prior art. Thus, it is much easier to couple RF to the wafer through a clamp in accordance with the present invention.

Having thus described the present invention it will be apparent to those of skill in the art that various modifications can be made within the spirit and scope of the present invention. For example, as previous noted, other materials could be used for wafer 20. For example, an aluminum wafer could be used as well.

We claim:

1. An electrostatic clamp comprising:
   a non-insulating wafer;
   a capacitor formed on one of the major surfaces of said wafer, said capacitor having plates comprising first and second conductive buses and a plurality of concentric rings alternatively connected to said first and second buses; and
   a dielectric coating of approximately four microns thickness on said plates.

2. The electrostatic clamp as set forth in claim 1 wherein said wafer is coated with an insulating layer and wherein said clamp further comprises:
   a conductive support on which said wafer rests.

3. The electrostatic clamp as set forth in claim 1 wherein said wafer comprises silicon.

4. A process for making an electrostatic clamp comprising the steps of:
   forming a first insulating layer, having a thickness on the order of one micron, on at least one major surface of a non-insulating wafer;
   depositing a conductive layer on said insulating layer;
   patterning said conductive layer to form a plurality of concentric rings and two buses wherein alternate rings are connected to the same bus; and
   coating said rings and buses with a second insulating layer having a thickness on the order of four microns.

5. The process as set forth in claim 4 wherein said first insulating layer is formed on both major surfaces of said wafer.

* * * * *